United States Patent
Danilov et al.

(10) Patent No.: US 10,783,022 B2
(45) Date of Patent: Sep. 22, 2020

(54) IMMEDIATE REPLICATION FOR DEDICATED DATA BLOCKS

(71) Applicant: EMC IP Holding Company LLC, Hopkinton, MA (US)

(72) Inventors: Mikhail Danilov, Saint Petersburg (RU); Lu Lei, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/053,872

(22) Filed: Aug. 3, 2018

(65) Prior Publication Data

US 2020/0042179 A1    Feb. 6, 2020

(51) Int. Cl.
| | |
|---|---|
| G06F 3/06 | (2006.01) |
| G06F 11/07 | (2006.01) |
| H03M 13/15 | (2006.01) |
| H04L 29/08 | (2006.01) |

(52) U.S. Cl.
CPC .......... *G06F 11/0727* (2013.01); *G06F 3/064* (2013.01); *G06F 3/0604* (2013.01); *G06F 3/067* (2013.01); *G06F 3/0647* (2013.01); *H03M 13/154* (2013.01); *H04L 67/1097* (2013.01)

(58) Field of Classification Search
None
See application file for complete search history.

(56) References Cited

U.S. PATENT DOCUMENTS

| | | | |
|---|---|---|---|
| 5,519,855 | A | 5/1996 | Neeman et al. |
| 5,758,347 | A | 5/1998 | Lo et al. |
| 5,987,468 | A | 11/1999 | Singh et al. |
| 6,070,003 | A | 5/2000 | Gove et al. |
| 6,550,035 | B1 | 4/2003 | Okita |
| 6,910,213 | B1 | 6/2005 | Hirono et al. |
| 7,069,469 | B2 | 6/2006 | Pillutla et al. |
| 7,549,110 | B2 | 6/2009 | Stek et al. |
| 7,559,007 | B1 | 7/2009 | Wilkie |
| 7,581,156 | B2 | 8/2009 | Manasse |
| 7,707,232 | B2 | 4/2010 | Dussud et al. |
| 8,458,515 | B1 | 6/2013 | Saeed |
| 8,532,212 | B2 | 9/2013 | Ito |
| 8,683,296 | B2 | 3/2014 | Anderson et al. |

(Continued)

OTHER PUBLICATIONS

Non-Final Offic Action dated May 16, 2018 for U.S. Appl. No. 15/193,141; 46 pages.

(Continued)

*Primary Examiner* — Charles J Choi

(74) *Attorney, Agent, or Firm* — Amin, Turocy & Watson, LLP

(57) ABSTRACT

The systems and methods disclosed herein relate to immediate replication for protected dedicated chunk. In one embodiment, a method comprises generating an encoded portion of data of a dedicated chunk in a node device of a first group of node devices in a first zone of a distributed storage system. The method further comprises, in immediate response to the generating, transferring the encoded portion of data of the dedicated chunk from the node device of the first group of node devices in the first zone of the distributed storage system to a second zone of the distributed storage system. The method further comprises dividing, by the system, the encoded portion of data in the second zone across second node devices.

20 Claims, 9 Drawing Sheets

(56) References Cited

U.S. PATENT DOCUMENTS

| | | | |
|---|---|---|---|
| 8,683,300 | B2 | 3/2014 | Stek et al. |
| 8,762,642 | B2 | 6/2014 | Bates et al. |
| 8,843,459 | B1 | 9/2014 | Aston et al. |
| 8,886,781 | B2 | 11/2014 | Jain et al. |
| 8,914,706 | B2 | 12/2014 | Anderson |
| 8,976,636 | B1 | 3/2015 | Martin et al. |
| 9,053,114 | B1 | 6/2015 | Lemar et al. |
| 9,244,618 | B1 | 1/2016 | Martin et al. |
| 9,268,806 | B1 | 2/2016 | Kesselman |
| 9,448,927 | B1 | 9/2016 | Agarwala et al. |
| 9,588,849 | B2 | 3/2017 | Sinha |
| 9,753,807 | B1 | 9/2017 | Donlan et al. |
| 9,760,446 | B2 | 9/2017 | Hammer |
| 9,921,910 | B2 | 3/2018 | Sangamkar et al. |
| 9,928,005 | B2 | 3/2018 | Sinha |
| 10,061,697 | B2 | 8/2018 | Danilov et al. |
| 10,067,696 | B2 | 9/2018 | Malygin et al. |
| 10,110,258 | B2 | 10/2018 | Trusov et al. |
| 10,133,638 | B1 | 11/2018 | Sakdeo et al. |
| 10,133,770 | B2 | 11/2018 | Danilov et al. |
| 10,146,600 | B2 | 12/2018 | Kurilov et al. |
| 10,152,248 | B2 | 12/2018 | Danilov et al. |
| 10,152,376 | B2 | 12/2018 | Danilov et al. |
| 10,248,326 | B2 | 4/2019 | Danilov et al. |
| 10,291,265 | B2 | 5/2019 | Trusov et al. |
| 10,346,066 | B2 | 7/2019 | Danilov et al. |
| 10,379,780 | B2 | 8/2019 | Fomin et al. |
| 10,564,883 | B2 | 2/2020 | Danilov et al. |
| 2002/0009134 | A1 | 1/2002 | Fischel et al. |
| 2002/0073103 | A1 | 6/2002 | Bottomley et al. |
| 2002/0099765 | A1 | 7/2002 | Otis |
| 2005/0038968 | A1 | 2/2005 | Iwamura et al. |
| 2005/0071335 | A1 | 3/2005 | Kadatch |
| 2006/0074990 | A1 | 4/2006 | Burka et al. |
| 2006/0105724 | A1 | 5/2006 | Nakao |
| 2006/0147219 | A1 | 7/2006 | Yoshino et al. |
| 2006/0155946 | A1 | 7/2006 | Ji |
| 2006/0212495 | A1 | 9/2006 | Tokunaga et al. |
| 2007/0177739 | A1 | 8/2007 | Ganguly et al. |
| 2008/0126357 | A1 | 5/2008 | Casanova et al. |
| 2008/0263114 | A1 | 10/2008 | Nath et al. |
| 2008/0307006 | A1 | 12/2008 | Lee et al. |
| 2009/0112953 | A1 | 4/2009 | Barsness et al. |
| 2009/0249005 | A1 | 10/2009 | Bender et al. |
| 2010/0037056 | A1 | 2/2010 | Follis et al. |
| 2010/0076940 | A1 | 3/2010 | Bordawekar et al. |
| 2010/0091842 | A1 | 4/2010 | Ikeda et al. |
| 2010/0180176 | A1 | 7/2010 | Yosoku et al. |
| 2010/0198849 | A1 | 8/2010 | Thomas et al. |
| 2010/0246663 | A1 | 9/2010 | Citta et al. |
| 2010/0325351 | A1 | 12/2010 | Bennett |
| 2011/0029840 | A1 | 2/2011 | Ozzie et al. |
| 2011/0053639 | A1 | 3/2011 | Etienne Suanez et al. |
| 2011/0055494 | A1 | 3/2011 | Roberts et al. |
| 2011/0184997 | A1 | 7/2011 | Grube et al. |
| 2011/0196900 | A1 | 8/2011 | Drobychev et al. |
| 2011/0246543 | A1 | 10/2011 | Gracie et al. |
| 2012/0047339 | A1 | 2/2012 | Decasper et al. |
| 2012/0051208 | A1 | 3/2012 | Li et al. |
| 2012/0060072 | A1 | 3/2012 | Simitci et al. |
| 2012/0095970 | A1 | 4/2012 | Shyam et al. |
| 2012/0106595 | A1 | 5/2012 | Bhattad et al. |
| 2012/0246204 | A1 | 9/2012 | Nalla et al. |
| 2013/0067187 | A1 | 3/2013 | Moss et al. |
| 2013/0080862 | A1 | 3/2013 | Bennett |
| 2013/0138646 | A1 | 5/2013 | Sier et al. |
| 2013/0159603 | A1 | 6/2013 | Whitney |
| 2013/0185337 | A1 | 7/2013 | Lipcon |
| 2013/0282676 | A1 | 10/2013 | Wade et al. |
| 2014/0046997 | A1 | 2/2014 | Dain et al. |
| 2014/0047040 | A1 | 2/2014 | Patiejunas et al. |
| 2014/0136897 | A1 | 5/2014 | Selivanov |
| 2014/0201541 | A1 | 7/2014 | Paul et al. |
| 2014/0344216 | A1 | 11/2014 | Abercrombie et al. |
| 2014/0351486 | A1 | 11/2014 | Baryudin |
| 2014/0380125 | A1 | 12/2014 | Calder et al. |
| 2015/0106578 | A1 | 4/2015 | Warfield et al. |
| 2015/0363270 | A1 | 12/2015 | Hammer |
| 2015/0378626 | A1 | 12/2015 | Motwani et al. |
| 2016/0004605 | A1 | 1/2016 | Ahn et al. |
| 2016/0041870 | A1 | 2/2016 | Davis et al. |
| 2016/0092109 | A1 | 3/2016 | Wu et al. |
| 2016/0098346 | A1 | 4/2016 | Pechanec et al. |
| 2016/0210202 | A1 | 7/2016 | Sinha |
| 2016/0239384 | A1 | 8/2016 | Slik et al. |
| 2016/0246677 | A1 | 8/2016 | Sangamkar et al. |
| 2016/0334996 | A1* | 11/2016 | Zhong ................. G06F 3/0607 |
| 2016/0378508 | A1 | 12/2016 | Chapman et al. |
| 2017/0004044 | A1 | 1/2017 | Tormasov et al. |
| 2017/0046127 | A1 | 2/2017 | Fletcher et al. |
| 2017/0052742 | A1* | 2/2017 | Hassan ................. G06F 3/0611 |
| 2017/0060898 | A1 | 3/2017 | Lu et al. |
| 2017/0075947 | A1 | 3/2017 | Kurilov et al. |
| 2017/0083549 | A1 | 3/2017 | Danilov et al. |
| 2017/0090766 | A1 | 3/2017 | Gong et al. |
| 2017/0091085 | A1 | 3/2017 | Davis et al. |
| 2017/0131912 | A1 | 5/2017 | Sinha |
| 2017/0242732 | A1 | 8/2017 | Vairavanathan et al. |
| 2017/0277915 | A1 | 9/2017 | Slik |
| 2017/0286309 | A1 | 10/2017 | Danilov et al. |
| 2017/0286436 | A1 | 10/2017 | Neporada et al. |
| 2018/0004786 | A1 | 1/2018 | Danilov et al. |
| 2018/0113769 | A1 | 4/2018 | Ahn et al. |
| 2018/0165190 | A1 | 6/2018 | Danilov et al. |
| 2018/0165299 | A1 | 6/2018 | Danilov et al. |
| 2018/0165323 | A1 | 6/2018 | Danilov et al. |
| 2019/0236051 | A1 | 8/2019 | Datta |

OTHER PUBLICATIONS

Notice of Allowance dated May 21, 2018 for U.S. Appl. No. 15/193,142; 47 pages.

Response to U.S. Non-Final Office Action dated Nov. 27, 2017 for U.S. Appl. No. 15/186,576; Response filed Feb. 23, 2018; 10 pages.

Final Office Action dated Mar. 1, 2018 for U.S. Appl. No. 15/193,145; 66 pages.

Final Office Action dated Mar. 2, 2018 for U.S. Appl. No. 15/193,409; 13 pages.

Non-Final Office Action dated Feb. 2, 2018 for U.S. Appl. No. 15/398,826; 73 pages.

Office Action dated Nov. 27, 2017 from U.S. Appl. No. 15/186,576; 19 pages.

Office Action dated Dec. 14, 2017 from U.S. Appl. No. 15/281,172; 16 pages.

Response to Office Action dated Sep. 15, 2017 from U.S. Appl. No. 15/193,409, filed Dec. 14, 2017; 14 pages.

Response to Office Action dated Oct. 5, 2017 from U.S. Appl. No. 15/193,407, filed Dec. 20, 2017; 15 pages.

Response to Office Action dated Oct. 18, 2017 from U.S. Appl. No. 15/193,145, filed Jan. 17, 2018; 14 pages.

Non-Final Office Action dated Oct. 5, 2017 for U.S. Appl. No. 15/193,407; 20 pages.

Non-Final Office Action dated Oct. 18, 2017 for U.S. Appl. No. 15/193,145; 50 pages.

Non-Final Office Action dated Sep. 15, 2017 for U.S. Appl. No. 15/193,409; 22 pages.

Anvin, "The mathematics of RAID-6;" Zytor; Dec. 20, 2011; 9 pages.

Blomer et al.; "An XOR-Based Erasure-Resilient Coding Scheme" International Computer ScienceInstitute, Berkley, California; 1995; 19 pages.

Non-Final Office Action dated Jun. 18, 2018 for U.S. Appl. No. 15/398,819; 32 pages.

Final Office Action dated Jun. 19, 2018 for U.S. Appl. No. 15/398,826; 66 pages.

Response to U.S. Non-Final Office Action dated Dec. 14, 2017 for U.S. Appl. No. 15/281,172; Response Filed on Apr. 9, 2018; 12 pages.

Non-Final Office Action dated May 17, 2018 for U.S. Appl. No. 14/929,788; 38 pages.

(56) References Cited

OTHER PUBLICATIONS

Notice of Allowance dated Jul. 13, 2018 for U.S. Appl. No. 15/281,172, 22 pages.
Non-Final Office Action dated May 10, 2018, for U.S. Appl. No. 15/193,407; 22 pages.
Non-Final Office Action dated Mar. 20, 2018, for U.S. Appl. No. 15/193,144; 29 pages.
Non-Final Office Action dated Aug. 10, 2018 for U.S. Appl. No. 15/423,080, 24 pages.
Notice of Allowance dated Jul. 23, 2018 for U.S. Appl. No. 15/193,141; 26 pages.
Response to U.S. Non-Final Office Action dated May 16, 2018 for U.S. Appl. No. 15/193,141;Response filed Jun. 19, 2018; 10 pages.
Non-Final Office Action dated Aug. 2, 2018 for U.S. Appl. No. 15/620,897, 29 pages.
Non-Final Office Action dated Aug. 15, 2018 for U.S. Appl. No. 15/083,324, 41 pages.
Notice of Allowance received for U.S. Appl. No. 15/398,826 dated Oct. 16, 2018, 70 pages.
Final Office Action received for U.S. Appl. No. 15/398,832 dated Apr. 9, 2020, 27 pages.
Non-Final Office Action received for U.S. Appl. No. 15/398,832 dated Dec. 4, 2019, 43 pages.
Rua et al., "BR-Tree: A Scalable Prototype for Supporting Multiple Queries of Multidimensional Data", IEEE Transactions on Computers, vol. 58, No. 12, Dec. 2009, pp. 1585-1598.
Final Office Action received for U.S. Appl. No. 15/083,324 dated Feb. 25, 2019, 25 pages.
Notice of Allowance received for U.S. Appl. No. 15/083,324 dated May 16, 2019, 23 pages.
Non-Final Office Action received for U.S. Appl. No. 15/620,898 dated Apr. 11, 2019, 37 pages.
Final Office Action received for U.S. Appl. No. 15/620,898 dated Oct. 29, 2019, 28 pages.
Non-Final Office Action received for U.S. Appl. No. 15/620,898 dated Mar. 5, 2020, 21 pages.
Non-Final Office Action received for U.S. Appl. No. 15/620,892 dated Feb. 21, 2020, 27 pages.
Final Office Action received for U.S. Appl. No. 15/620,892 dated Oct. 31, 2019, 23 pages.
Non-Final Office Action received for U.S. Appl. No. 15/620,892 dated Mar. 21, 2019, 36 pages.
Non-Final Office Action received for U.S. Appl. No. 15/193,409 dated Aug. 28, 2018, 10 pages.
Notice of Allowance received for U.S. Appl. No. 15/193,407 dated Oct. 9, 2018, 19 pages.
Final Office Action received for U.S. Appl. No. 15/620,897 dated Dec. 26, 2018, 25 pages.
Non-Final Office Action received for U.S. Appl. No. 15/620,897 dated Jun. 27, 2019, 26 pages.
Non-Final Office Action received for U.S. Appl. No. 15/620,900 dated Mar. 21, 2019, 41 pages.
Final Office Action received for U.S. Appl. No. 15/620,900 dated Oct. 29, 2019, 24 pages.
Non-Final Office Action received for U.S. Appl. No. 15/620,900 dated Feb. 21, 2020, 23 pages.
Non-Final Office Action received for U.S. Appl. No. 14/929,788 dated Jun. 11, 2019, 15 pages.
Final Office Action received for U.S. Appl. No. 14/929,788 dated Dec. 5, 2018, 17 pages.
Response to Non-Final Office Action received for U.S. Appl. No. 15/398,819 dated Jun. 18, 2018 filed Sep. 17, 2018, 10 pages.
RCE and Response to Final Office Action received for U.S. Appl. No. 15/398,826 dated Jun. 19, 2018 filed Aug. 23, 2018, 11 pages.
Notice of Allowance received for U.S. Appl. No. 15/186,576 dated May 15, 2018, 22 pages.
Response to Non-Final Office Action received for U.S. Appl. No. 15/193,407 dated May 10, 2018 filed Jun. 28, 2018, 11 pages.
Response to Non-Final Office Action received for U.S. Appl. No. 15/083,324 dated Aug. 15, 2018 filed Oct. 31, 2018, 13 pages.

* cited by examiner

IMMEDIATE REPLICATION FOR DEDICATED DATA BLOCKS

TECHNICAL FIELD

The subject disclosure relates generally to immediate replication for dedicated data blocks, e.g., immediate replication for protected dedicated chunks.

BACKGROUND

Elastic Cloud Storage (ECS) systems can perform disk capacity management while hardly relying on a file system. All disk space can be partitioned into blocks of fixed sized called chunks. All information, user data and all kinds of metadata, can be stored in these chunks. ECS can protect user data at the chunk level. The way ECS organizes replication of user data is conventional for storage systems with asynchronous replication. By the time a replication task starts, all user data has already landed to storage devices (a non-volatile memory) across a cluster and has been already discarded from RAM (a volatile memory). Therefore, a replication task needs to read user data from different nodes to be able to replicate it. This can produce undesirable disk and network traffic. There is a need for a new method to organize replication of user data in ECS.

Attempts to implement immediate replication in ECS, after data has been protected in non-volatile memory and before it has been discarded from volatile memory, have proven to be unsustainable. One chunk can be filled with segments of several objects created by different write transactions. In this case, synchronous replication at the chunk level can be tricky to synchronize input data traffic and replication. Additionally, immediate replication of potentially small object segments over inter-zone network can have low efficiency.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Systems, methods, computer readable media, etc. disclosed herein relate to immediate replication for protected dedicated chunk. In one aspect, a system comprises a processor and a memory that stores executable instructions that, when executed by the processor, facilitate performance of operations. Moreover, the operations comprise transferring an encoded portion of data of a dedicated chunk from a node device of a first group of node devices in a first zone of a distributed storage system to a second zone of the distributed storage system. The operations further comprise dividing the encoded portion of the data in the second zone across a second group of node devices of the second zone.

One embodiment of the specification relates to a method that comprises transferring, by a system comprising a processor, an encoded portion of data of a dedicated chunk from a node device of first node devices in a first zone to a second zone of a distributed storage system, wherein the encoded portion of the data is generated from an encoding of a portion of the data. The method further comprises dividing, by the system, the encoded portion of data in the second zone across second node devices.

Another embodiment of the specification relates to a computer-readable storage medium comprising instructions that, in response to execution, cause a device comprising a processor to perform operations, comprising transferring an encoded portion of data of a dedicated chunk from a first node of a first plurality of nodes in a first zone to a second node of second plurality of nodes in a second zone of a storage system. Further, the operations comprise dividing the encoded portion of data in the second zone across the second plurality of nodes.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1A:
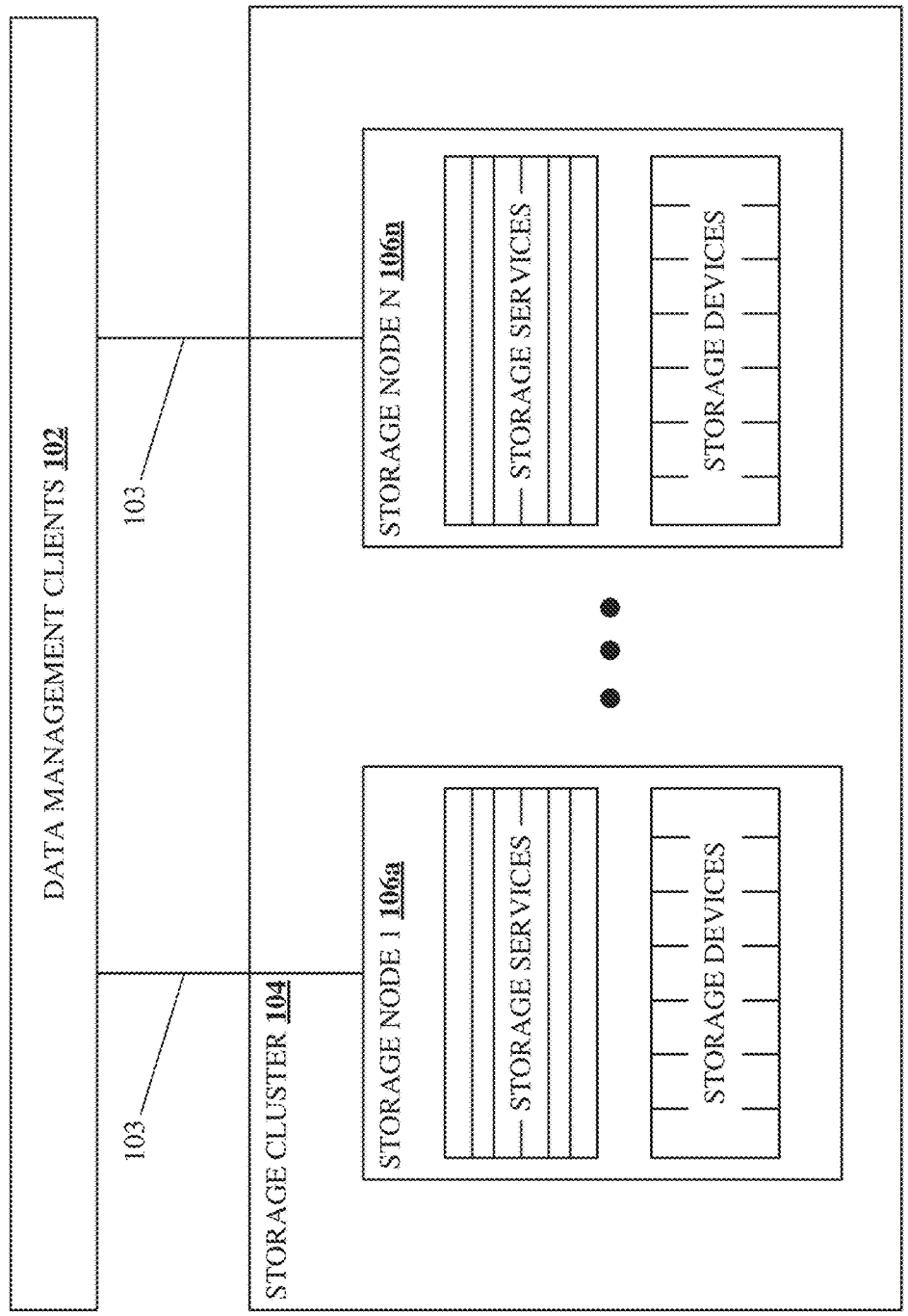
FIG. 1A illustrates a block diagram of an example, non-limiting distributed storage system facilitating immediate replication for protected dedicated chunk in accordance with one or more embodiments described herein.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

Figure 1B:
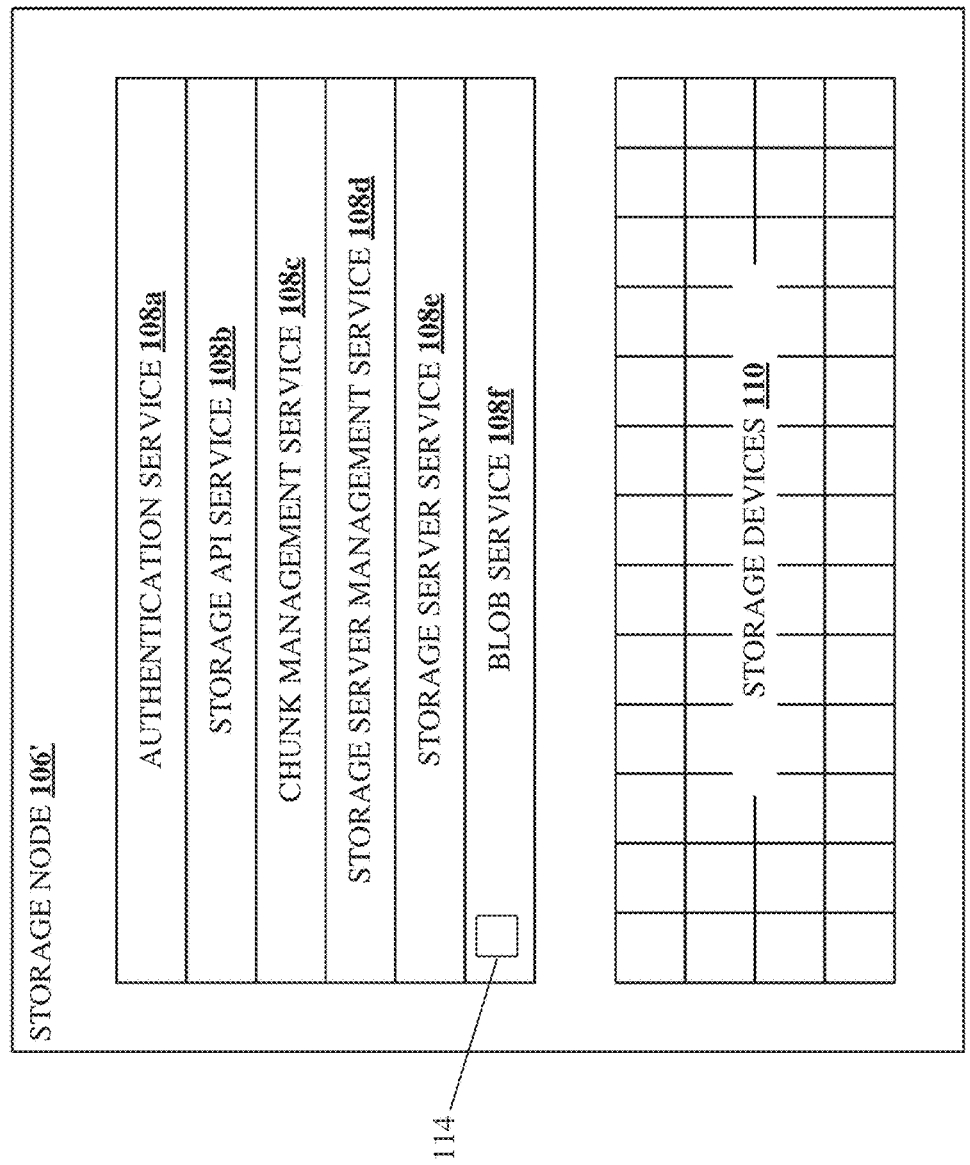
FIG. 1B illustrates a block diagram of an example, non-limiting storage node facilitating immediate replication for protected dedicated chunk in accordance with one or more embodiments described herein.

FIG. 1A illustrates a block diagram of an example, non-limiting distributed storage system 100 facilitating immediate replication for protected dedicated chunk in accordance with one or more embodiments described herein. Distributed storage system 100 can include one or more data management clients 102 in communication with a storage cluster 104 via a network 103. The network 103 can include any suitable type of communication network or combination thereof, including networks using protocols such as Ethernet, Internet Small Computer System Interface (iSCSI), Fibre Channel (FC), and/or wireless protocols. The data management clients 102 can include user applications, application servers, data management tools, and/or testing systems. The storage cluster 104 can include one or more storage nodes 106a, . . . , 106n (generally denoted as storage node 106'). An illustrative storage node is shown in FIG. 1B and described below in conjunction therewith.

In general operation, data management clients 102 can issue requests to the storage cluster 104 to read and write data. Write requests can include requests to store new data and requests to update previously stored data. Data read and write requests can include an ID value to uniquely identify the data within the storage cluster 104. A client request can be received by any available storage node 106'. The receiving storage node 106' can process the request locally and/or delegate request processing to one or more peer storage nodes 106'. For example, if a client issues a data read request, the receiving storage node 106' can delegate/proxy the request to peer storage node 106' where the data resides.

In some embodiments, the distributed storage system 100 can comprise an object storage system, wherein arbitrary-sized blobs of user data can be read and written in the form of objects, which are uniquely identified by object identifications (IDs). In some embodiments, the storage cluster 104 can utilize Elastic Cloud Storage (ECS). In some embodiments, the storage cluster 104 can store user data and various types of metadata within fixed-sized chunks. Chunks can be of different types, one type per capacity user. The contents of a chunk can be appended to until the chunk becomes "full" (e.g., until its capacity is exhausted or nearly exhausted). When a chunk becomes full, it can be marked as "sealed." The storage cluster 104 can treat sealed chunks as immutable. In some embodiments, the storage cluster 104 can utilize different types of chunks. For example, user data can be stored in so-called "repository" or "repo" chunks (generally denoted as chunks). As another example, metadata can be stored in tree-like structures stored within "tree" chunks.

In some embodiments, a repository chunk can include one or more "segments," which can correspond to data for a single object. In some embodiments, a given object can be stored within one or more repository chunks and a given repository chunk can store segments of several user objects. In some embodiments, a repository chunk can be referred to as a "dedicated chunk" if all its segments correspond to a single object, and otherwise can be referred to as a "shared chunk."

FIG. 1B illustrates a block diagram of an example, non-limiting storage node 106' facilitating immediate replication for protected dedicated chunk in accordance with one or more embodiments described herein. Storage node 106', which can be the same as or similar to storage nodes 106a, . . . , 106n in FIG. 1A. Storage node 106' can include one or more services 108a-108f (generally denoted as storage services 108) and one or more storage devices 110. A storage node 106' can include a processor (not shown) configured to execute instructions provided by storage services 108.

In the embodiment of FIG. 1B, a storage node 106' can include the following services: authentication service 108a, storage application program interface (API) service 108b, chunk management service 108c, storage server management service 108d, storage server service 108e and blob service 108f. Authentication service 108a can authenticate requests from data management clients 102. Storage API service 108b can parse and interpret requests from data management clients 102. Chunk management service 108c can facilitate storage chunk allocation or reclamation for different storage system needs and monitor storage chunk health and usage. Storage server management service 108d can manage available storage devices capacity and track storage devices states. Storage server service 108e can interface with the storage devices 110. Blob service 108f can track the storage locations of objects in the system.

The blob service 108f can maintain an object table 114, which can include information about which repository chunk (or chunks) an object is stored within. TABLE 1 illustrates the type of information that can be maintained within the object table 114. In some embodiments, the chunk management service 108c, in coordination with the blob service 108f, can scan the entire object table 114. In some embodiments the object table 114 can be stored to a disk and, thus, scanning the object table can be an input/output-intensive (I/O-intensive) operation.

TABLE 1

| | Location Info | | |
|---|---|---|---|
| Object ID | Chunk ID | Offset | Length |
| 1 | X | 0 | 2 |
| | X | 4 | 1 |
| 2 | X | 2 | 2 |

Figure 2:
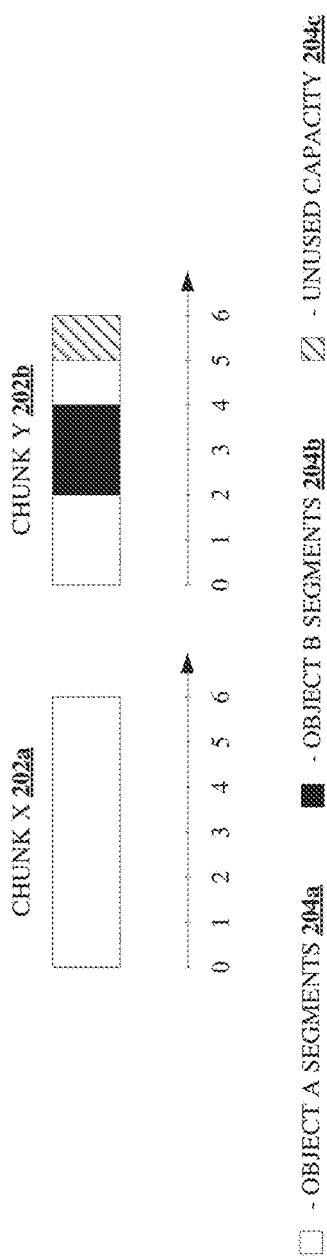
FIG. 2 illustrates a block diagram of example, non-limiting storage chunks facilitating immediate replication for protected dedicated chunk in accordance with one or more embodiments described herein.

Referring to FIG. 2, which illustrates a block diagram of example, non-limiting storage chunks 200 facilitating immediate replication for protected dedicated chunk in accordance with one or more embodiments described herein. Storage system 200 can have one or more chunks storing one or more objects in accordance with one or more embodiments described herein. As shown in FIG. 2, chunk X 202a can store object A segments 204a, and chunk Y 202b can store object A segments 204a and object B segments 204b. Chunk Y 202b can also have unused capacity 204c. Chunk X 202a can be referred to as a "dedicated chunk" because all of its object segments correspond to a single object (e.g., object A segments 204a), and chunk Y 202b can be referred to as a "shared chunk" because it includes segments from multiple objects (e.g., objects A segments 204a and objects B segments 204b).

In some embodiments, dedicated chunks can be generated in different ways. In some embodiments, the storage system can allow a user to specify an object's size (sometimes referred to as "hint") before the object is uploaded to the system. In such embodiments, the storage system can explicitly allocate one or more dedicated chunks for sufficiently large objects. In certain embodiments, chunks that are explicitly allocated and dedicated to large objects can be assigned a special chunk type (e.g., "Type-II").

In some embodiments, dedicated chunks can be the implicit result of certain I/O write patterns. In certain embodiments, implicitly-created dedicated chunks can be more likely to occur in single-threaded applications. In some embodiments, the storage system can intentionally seal chunks that are not yet full in order to increase the percentage of dedicated chunks within the system.

TABLE 2 illustrates an example of location information that can be maintained within an object table (e.g., object table 114 of FIG. 1B) for the storage system 200.

TABLE 2

| | Location Info | | |
|---|---|---|---|
| Object ID | Chunk ID | Offset | Length |
| A (204a) | X (202a) | 0 | 6 |
| | Y (202b) | 0 | 2 |
| B (204b) | Y (202b) | 2 | 2 |

Referring again to FIG. 2, the storage system 200 can use different techniques to detect dedicated chunks. In some embodiments, chunks that were explicitly allocated and dedicated to large objects can be detected based on the chunk type (e.g., "Type-II). In other embodiments, scanning the object table can be replaced with a lookup of the object's ID for dedicated chunks. For example, the storage system can detect dedicated chunks by looking up the object's ID because a dedicated chunk can be owned by a single object. The storage system can perform a lookup of the object's ID, and if the lookup returns one object ID for a chunk, the chunk is a dedicated chunk.

In some embodiments, the storage system can detect dedicated chunks using the following heuristic: (1) when a chunk is sealed, the storage system can track the amount of data (e.g., number of bytes) written to the chunk up to that point; (2) the storage system can use the object table to determine if any object has that same amount of data as the amount stored within the sealed chunk; and (3) if so, the storage system can determine that the chunk is a dedicated chunk because no other object is stored within the sealed chunk. For example, referring to FIG. 2 and TABLE 2, using the object table, the storage system can determine that object A segments 204a occupies six units of chunk 202a capacity; knowing that object 204a occupies six units of data written to chunk X 202a at the time it was sealed, the storage system can efficiently determine that chunk X 202a is a dedicated chunk.

Figure 3:
FIG. 3 illustrates a block diagram of an example, non-limiting distributed storage system facilitating immediate replication for protected dedicated chunk in accordance with one or more embodiments described herein.

Referring to FIG. 3, which illustrates a block diagram of an example, non-limiting distributed storage system 300 (e.g., storage cluster 104 from FIG. 1A) facilitating immediate replication for protected dedicated chunk in accordance with one or more embodiments described herein. Distributed storage system 300 can include a group of sixteen (16) nodes, node 1 301 through node 16 316. ECS protects user data at the chunk level. During erasure coding operation, a chunk is divided into twelve (12) k data fragments as denoted by $D_1$ through $D_{12}$ and four (4) redundant m coding fragments as denoted by $C_1$ through $C_4$ are created. The way the coding is done assures that the system can tolerate the loss of any m coding fragments. The default scheme for erasure coding in ECS is 12+4, e.g., 12 k data fragments and 4 m coding fragments.

Any node 1 301 through node 16 316 can be the same or similar to the storage node 106' from FIG. 1B. When new data is added to the system (e.g., via data management clients 102 request), the distributed storage system 300 can divide the data into k data fragments $D_1, \ldots, D_{12}$, generate m coded fragments $C_1, \ldots, C_4$, and store the k data fragments and m coded fragments across the node 1 301 through node 16 316. As illustrated in FIG. 3, the k data fragments are stored in node 1 301 through node 12 312, and the m coded fragments are stored in node 13 313 through node 16 316.

Figure 4:
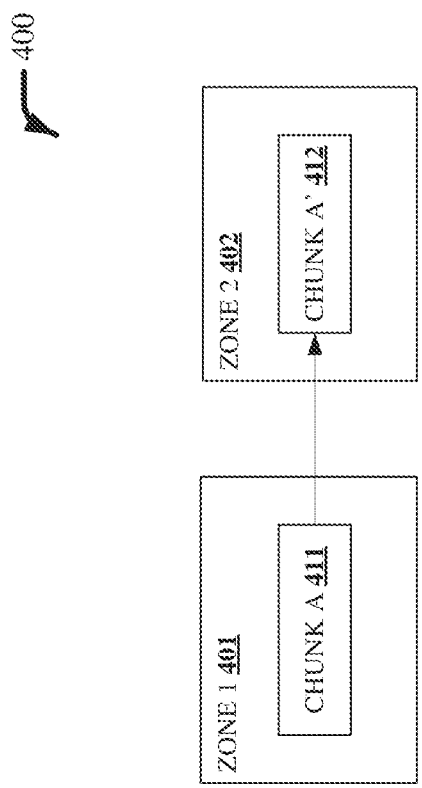
FIG. 4 illustrates a block diagram of an example, non-limiting high-level replication system facilitating immediate replication for protected dedicated chunk in accordance with one or more embodiments described herein.

Referring to FIG. 4, which illustrates a block diagram of an example, non-limiting high-level replication system 400 facilitating immediate replication for protected dedicated chunk in accordance with one or more embodiments described herein. Replication system 400 is an ECS system, which is cloud storage system that can support geographically distributed setups consisting of two or more zones. This feature is called GEO. GEO can be used to provide additional protection of user data by means of replication, which works at the chunk level as well. FIG. 4 illustrates two zones, Zone 1 401 and Zone 2 402. Zone 1 401 can create chunk A 411 and replicate chunk A 411 to Zone 2 402. Then Zone 2 402 can contain a backup copy of chunk A 411, which is chunk A' 412. A replication task is enqueued for a chunk user data that is being written to. When started, the task replicates all queued data from its chunk.

Figure 5:
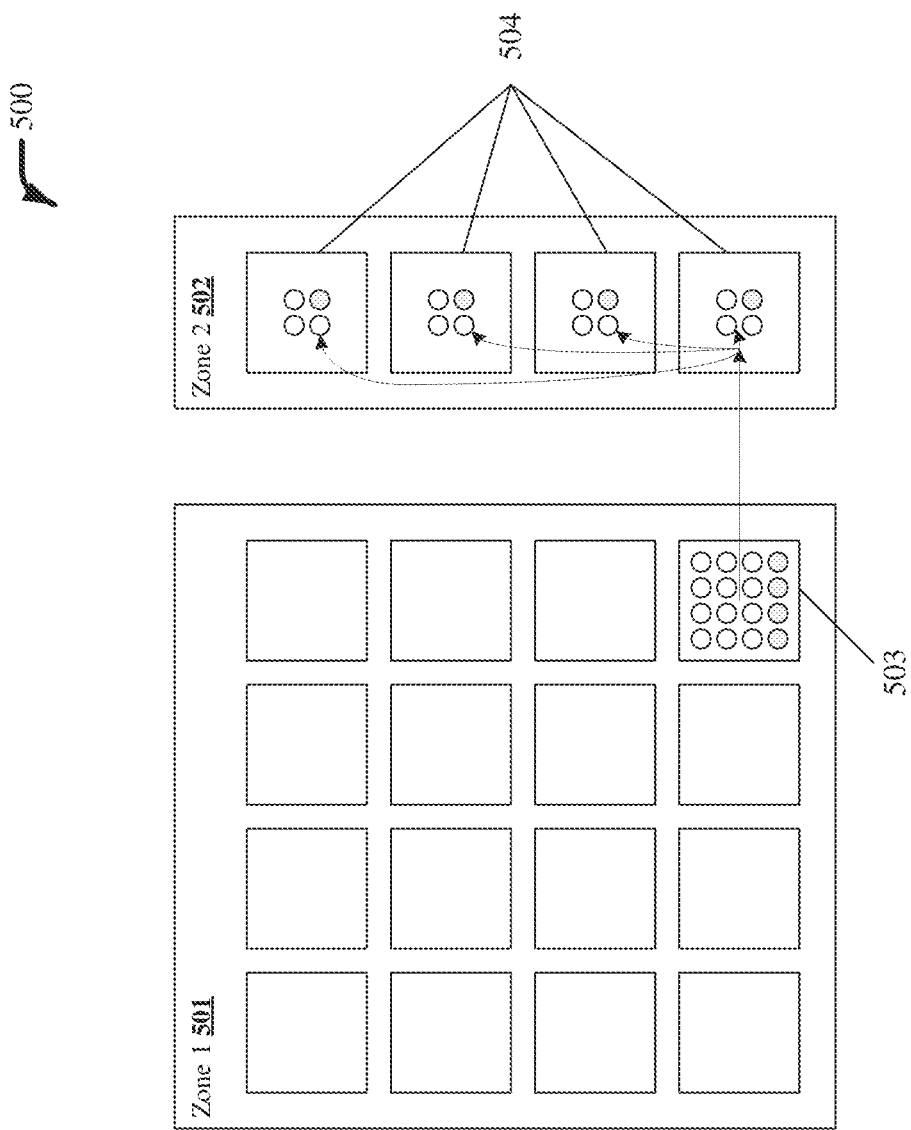
FIG. 5 illustrates a block diagram of an example, non-limiting system facilitating immediate replication for protected dedicated chunk in accordance with one or more embodiments described herein.

Referring to FIG. 5, which illustrates a block diagram of an example, non-limiting system 500 facilitating immediate replication for protected dedicated chunk in accordance with one or more embodiments described herein. More specifically, system 500 can facilitate immediate replication for protected dedicated chunk in ECS systems. Immediate replication for dedicated chunk can be resource-efficient replication for specific chunks called dedicated chunks. Replication can be immediate when replication happens after data has been protected in non-volatile memory and before it is discarded from volatile memory. Immediate replication can seem similar to synchronous replication, however, there are significant differences. With synchronous replication, replication is a mandatory part of a write transaction. That is, a storage system does not acknowledge a write transaction until replication of new data is completed. However, with immediate replication, replication can happen right away without mandating that replication of new data is completed before acknowledging a write transaction.

For example, a dedicated chunk can reside in random access memory (RAM) for a time required to protect it with erasure coding resulting in k data fragments and m coding fragments stored in storage devices (e.g., storage devices 110) across a cluster of nodes (e.g., storage node 106' within storage cluster 104). A dedicated chunk can be sent to a replication destination zone 2 502 while its content is available directly from RAM. Immediate replication of dedicated chunks is more sustainable than replication of normal chunks. For example, replication of a dedicated chunk can be simpler because a dedicated chunk is a solid portion of data from the same object, which can eliminate the need for synchronous replication and the need to acknowledge a write transaction. In case of a failure, the default replication method can be the fall back. Also, dedicated chunks are large data portions of the same object, so replication of dedicated chunks can be a bulk-mode data transfer, which is the most practical way to transfer data over an inter-zone network, e.g., from replication source zone 1 501 to replication destination zone 2 502.

The specific feature of dedicated chunks is that the coding fragments are available shortly after the chunks are filled up and there is a moment when both, data fragment and coding fragment, are available in RAM. This allows for immediate replication for dedicate chunks in a protected form. That is, a replication source zone 1 501 can transfer a dedicated chunk in the form of k data fragments and m coding fragments. That way a replication destination zone 2 502 does not have to use any preliminary protection schemes.

After replication is completed, all data can be protected using more efficient erasure coding.

As illustrated in FIG. 5, replication source zone 1 501 can create protected dedicated chunk 503 by performing on-the-fly encoding for it. No replication task is scheduled for the chunk. Data fragments and coding fragments available in RAM that is already encoded and protected can be sent to replication destination zone 2 502 immediately. Replication destination zone 2 502 can receive the data fragments and coding fragments and distribute them across the nodes 504. Immediate replication for protected dedicated chunk 503 can reduce disk and network traffic inside replication source zone 1 501. Additionally, immediate replication for protected dedicated chunk 503 can also use the simpler and more efficient bulk-mode transfer. Furthermore, immediate replication for protected dedicated chunk 503 can eliminate the need for replication destination zone 2 to use an inefficient intermediate protection scheme because protected dedicated chunk 503 is a protected data portion of an object.

Figure 6:
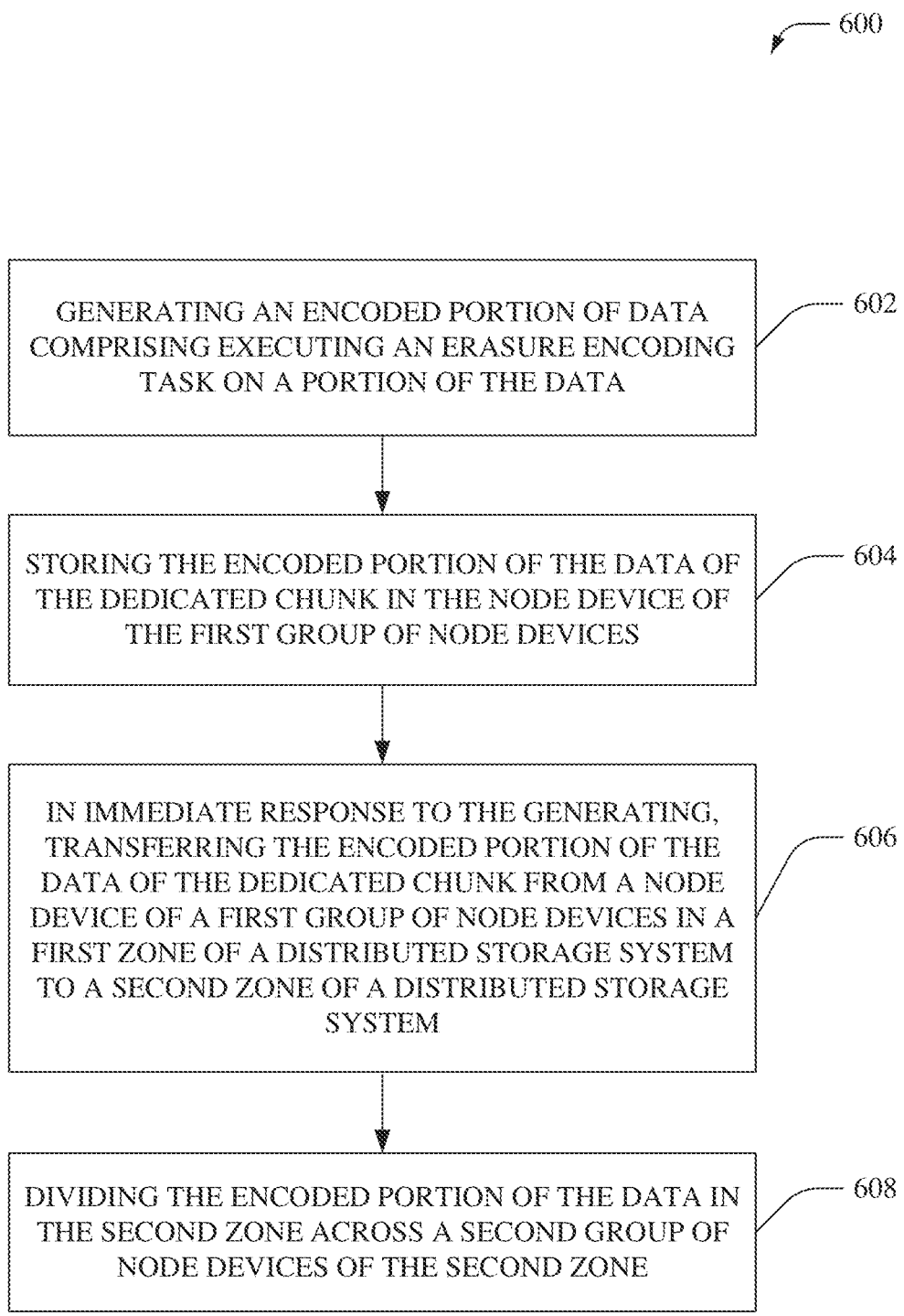
FIG. 6-7 illustrate example, non-limiting methods facilitating immediate replication for protected dedicated chunk in accordance with one or more embodiments described herein.

FIG. 6 illustrates an example, non-limiting method 600 facilitating immediate replication for protected dedicated chunk in accordance with one or more embodiments described herein. At 602, the method 600 can comprise generating an encoded portion of data comprising executing an erasure encoding task on a portion of the data. At 604, the method 600 can comprise storing the encoded portion of the data of the dedicated chunk in the node device of the first group of node devices. At 606, the method 600 can comprise, in immediate response to the generating, transferring the encoded portion of the data of the dedicated chunk from a node device of a first group of node devices in a first zone of a distributed storage system to a second zone of a distributed storage system. At 608, the method 600 can comprise dividing the encoded portion of the data in the second zone across a second group of node devices of the second zone.

Figure 7:
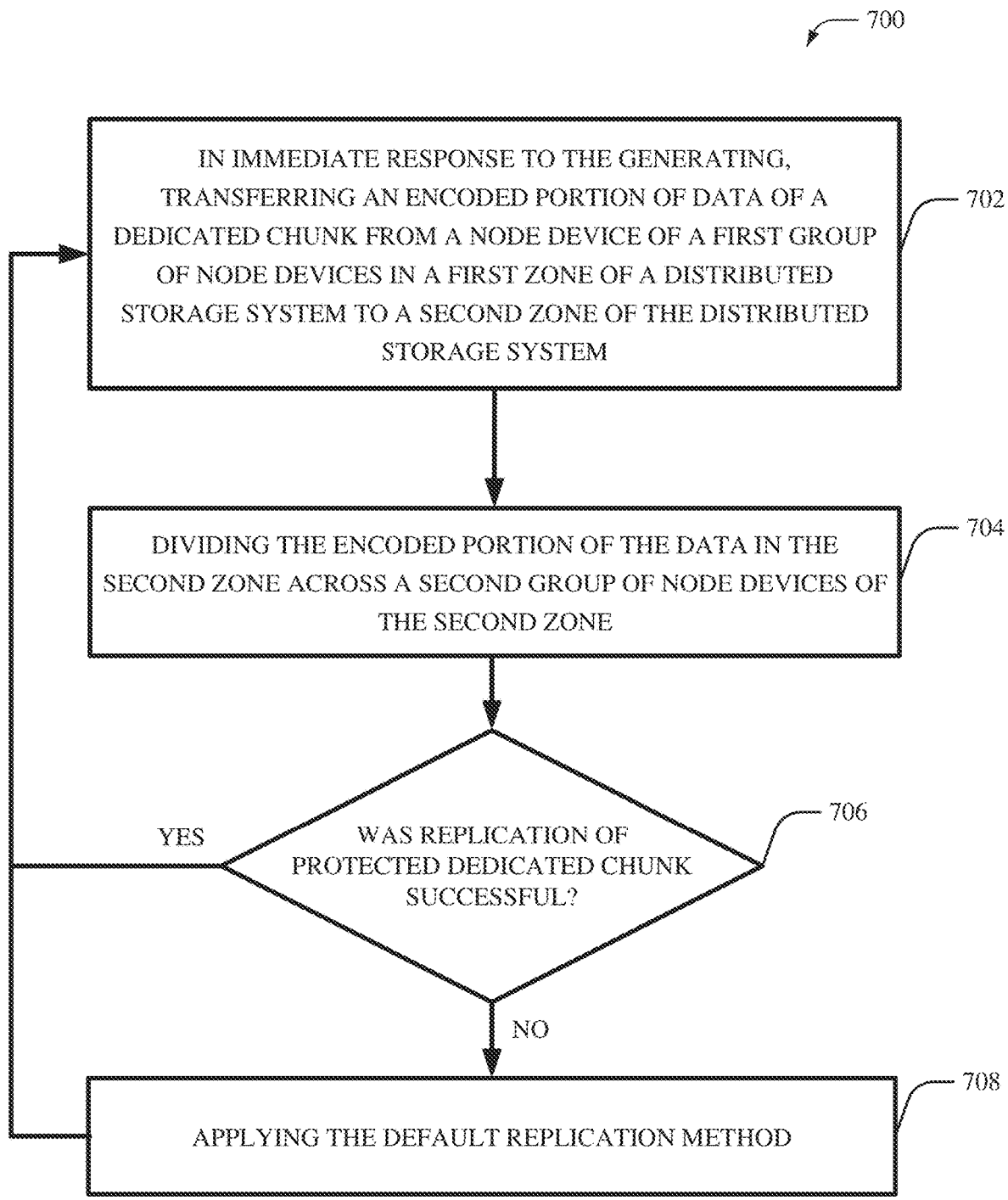

FIG. 7 illustrates an example, non-limiting method 700 facilitating immediate replication for protected dedicated chunk in accordance with one or more embodiments described herein. At 702, the method 700 can comprise, in immediate response to the generating (e.g., generating an encoded portion of data of a dedicated chunk in a node device of a first group of node devices in a first zone of a distributed storage system), transferring an encoded portion of data of a dedicated chunk from a node device of a first group of node devices in a first zone of a distributed storage system to a second zone of the distributed storage system. At 704, the method 700 can comprise dividing the encoded portion of the data in the second zone across a second group of node devices of the second zone. At 706, the method 700 can comprise determining whether replication of protected dedicated chunk was successful. If yes, the process continues at 702. If no, the process proceeds to 708. At 708, the method 700 can comprise applying the default replication method.

Figure 8:
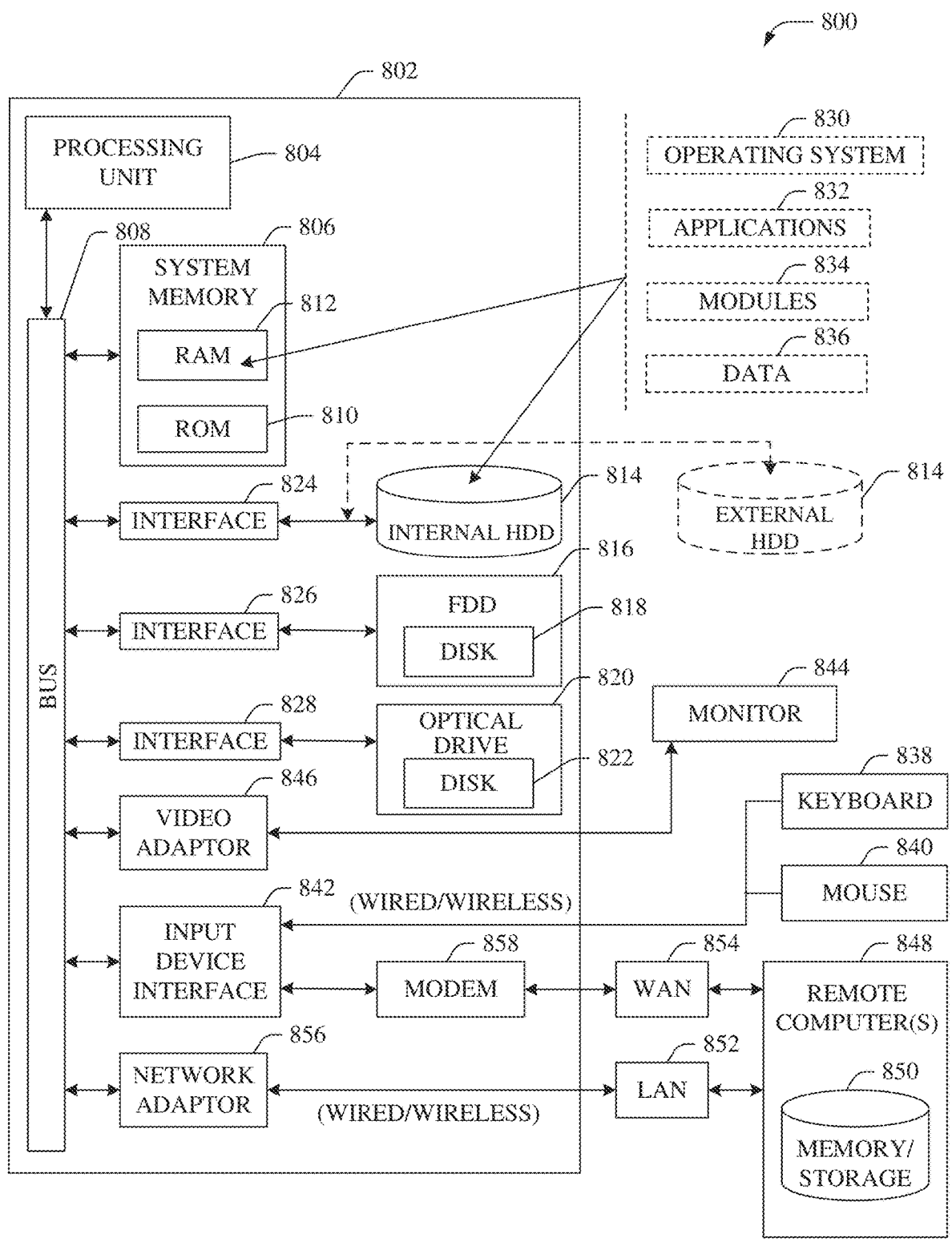
FIG. 8 illustrates a block diagram of an example computer operable to execute the disclosed communication architecture.

Referring now to FIG. 8, there is illustrated a block diagram of a computer 802 operable to execute the disclosed communication architecture. In order to provide additional context for various aspects of the disclosed subject matter, FIG. 8 and the following discussion are intended to provide a brief, general description of a suitable computing environment 800 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

With reference again to FIG. 8, the example environment 800 for implementing various aspects of the specification includes a computer 802, the computer 802 including a processing unit 804, a system memory 806 and a system bus 808. As an example, the component(s), server(s), node(s), cluster(s), system(s), and/or device(s) disclosed herein can include at least a portion of the computer 802. The system bus 808 couples system components including, but not limited to, the system memory 806 to the processing unit 804. The processing unit 804 can be any of various commercially available processors. Dual microprocessors and other multi-processor architectures can also be employed as the processing unit 804.

The system bus 808 can be any of several types of bus structure that can further interconnect to a memory bus (with or without a memory controller), a peripheral bus, and a local bus using any of a variety of commercially available bus architectures. The system memory 806 includes read-only memory (ROM) 810 and random access memory (RAM) 812. A basic input/output system (BIOS) is stored in a non-volatile memory 810 such as ROM, EPROM, EEPROM, which BIOS contains the basic routines that help to transfer information between elements within the computer 802, such as during startup. The RAM 812 can also include a high-speed RAM such as static RAM for caching data.

The computer 802 further includes an internal hard disk drive (HDD) 814, which internal hard disk drive 814 can also be configured for external use in a suitable chassis (not shown), a magnetic floppy disk drive (FDD) 816, (e.g., to read from or write to a removable diskette 818) and an optical disk drive 820, (e.g., reading a CD-ROM disk 822 or, to read from or write to other high capacity optical media such as the DVD). The hard disk drive 814, magnetic disk drive 816 and optical disk drive 820 can be connected to the system bus 808 by a hard disk drive interface 824, a magnetic disk drive interface 826 and an optical drive interface 828, respectively. The interface 824 for external drive implementations includes at least one or both of Universal Serial Bus (USB) and IEEE 1394 interface technologies. Other external drive connection technologies are within contemplation of the subject disclosure.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to a HDD, a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods of the specification.

A number of program modules can be stored in the drives and RAM 812, including an operating system 830, one or more application programs 832, other program modules 834 and program data 836. All or portions of the operating system, applications, modules, and/or data can also be cached in the RAM 812. It is appreciated that the specification can be implemented with various commercially available operating systems or combinations of operating systems.

A user can enter commands and information into the computer 802 through one or more wired/wireless input devices, e.g., a keyboard 838 and/or a pointing device, such as a mouse 840 or a touchscreen or touchpad (not illustrated). These and other input devices are often connected to the processing unit 804 through an input device interface 842 that is coupled to the system bus 808, but can be connected by other interfaces, such as a parallel port, an IEEE 1394 serial port, a game port, a USB port, an infrared (IR) interface, etc. A monitor 844 or other type of display device is also connected to the system bus 808 via an interface, such as a video adapter 846.

The computer 802 can operate in a networked environment using logical connections via wired and/or wireless communications to one or more remote computers, such as a remote computer(s) 848. The remote computer(s) 848 can be a workstation, a server computer, a router, a personal computer, portable computer, microprocessor-based entertainment appliance, a peer device or other common network node, and typically includes many or all of the elements described relative to the computer 802, although, for purposes of brevity, only a memory/storage device 850 is illustrated. The logical connections depicted include wired/wireless connectivity to a local area network (LAN) 852 and/or larger networks, e.g., a wide area network (WAN) 854. Such LAN and WAN networking environments are commonplace in offices and companies, and facilitate enterprise-wide computer networks, such as intranets, all of which can connect to a global communications network, e.g., the Internet.

When used in a LAN networking environment, the computer 802 is connected to the local network 852 through a wired and/or wireless communication network interface or adapter 856. The adapter 856 can facilitate wired or wireless communication to the LAN 852, which can also include a wireless access point disposed thereon for communicating with the wireless adapter 856.

When used in a WAN networking environment, the computer 802 can include a modem 858, or is connected to a communications server on the WAN 854, or has other means for establishing communications over the WAN 854, such as by way of the Internet. The modem 858, which can be internal or external and a wired or wireless device, is connected to the system bus 808 via the serial port interface 842. In a networked environment, program modules depicted relative to the computer 802, or portions thereof, can be stored in the remote memory/storage device 850. It will be appreciated that the network connections shown are example and other means of establishing a communications link between the computers can be used.

The computer 802 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at an 54 Mbps (802.11a) data rate, and/or a 2.4 GHz radio band at an 11 Mbps (802.11b), an 54 Mbps (802.11g) data rate, or up to an 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It will be appreciated that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
generating an encoded portion of data of a dedicated chunk in a node device of a first group of node devices in a first zone of a distributed storage system, wherein the encoded portion of the data comprises a group of data fragments and a group of coding fragments, and wherein the group of data fragments and the group of coding fragments are immediately allocated to volatile memory;
in immediate response to the generating, while the encoded portion of the data is available via the volatile memory, transferring the encoded portion of the data of the dedicated chunk from the node device of the first group of node devices in the first zone of the distributed storage system to a second zone of the distributed storage system after the encoded portion of the data has been protected in non-volatile memory and before the encoded portion of the data is discarded from the volatile memory; and
dividing the encoded portion of the data in the second zone across a second group of node devices of the second zone.

2. The system of claim 1, wherein the operations further comprise:
generating the encoded portion of the data comprising executing an erasure encoding task on a portion of the data.

3. The system of claim 1, wherein the operations further comprise:
storing the encoded portion of the data of the dedicated chunk in the node device of the first group of node devices.

4. The system of claim 1, wherein the operations further comprise:
detecting the dedicated chunk from one or more chunks in which the encoded portion of the data for a single object is stored.

5. The system of claim 4, wherein detecting the dedicated chunk comprises looking up an identification for the single object.

6. The system of claim 1, wherein the operations further comprise:
determining whether the dedicated chunk is immutably sealed, prior to the transferring of the encoded portion of the data of a dedicated chunk from the node device of the first group of node devices in the first zone to the second zone.

7. The system of claim 6, wherein the system tracks an amount of written data on the dedicated chunk prior to the dedicated chunk being immutably sealed.

8. A method, comprising:
generating, by a system comprising a processor, an encoded portion of data of a dedicated chunk in a node device of a first group of node devices in a first zone of a distributed storage system, wherein the encoded portion of the data comprises a group of data fragments and a group of coding fragments, and wherein the group of data fragments and the group of coding fragments are immediately designated to volatile memory;
in immediate response to the generating, while the encoded portion of the data is accessible via the volatile memory, transferring, by the system, the encoded portion of the data of the dedicated chunk from the node device of the first group of node devices in the first zone of the distributed storage system to a second zone of the distributed storage system after the encoded portion of the data has been protected in non-volatile memory and before the encoded portion of the data is discarded from the volatile memory; and
dividing, by the system, the encoded portion of the data in the second zone across second node devices.

9. The method of claim 8, further comprising executing, by the system, an erasure encoding task on the portion of the data to generate the encoded portion of the data.

10. The method of claim 8, further comprising storing, by the system, the encoded portion of the data of the dedicated chunk in the node device of the first node devices.

11. The method of claim 8, further comprising detecting, by the system, the dedicated chunk from at least one chunk in which the encoded portion of the data for a single object is stored.

12. The method of claim 11, wherein the detecting the dedicated chunk comprises looking up an identification for the single object.

13. The method of claim 8, further comprising determining, by the system, whether the dedicated chunk is sealed according to a threshold immutability prior to the transferring of the encoded portion of the data of a dedicated chunk from the node device of the first node devices in the first zone to the second zone.

14. The method of claim 13, further comprising tracking an amount of written data on the dedicated chunk prior to the dedicated chunk being immutably sealed.

15. A non-transitory computer-readable storage medium comprising instructions that, in response to execution, cause a device comprising a processor to perform operations, comprising:
generating an encoded portion of data of a dedicated chunk in a node device of a first group of node devices in a first zone of a distributed storage system, wherein the encoded portion of the data comprises a group of data fragments and a group of coding fragments, and wherein the group of data fragments and the group of coding fragments are immediately stored in volatile memory;
in immediate response to the generating, while the encoded portion of the data is accessible via the volatile memory, transferring the encoded portion of the data of the dedicated chunk from the node device of the first group of node devices in the first zone of the distributed storage system to a second zone of the distributed storage system after the encoded portion of the data has been protected in non-volatile memory and before the encoded portion of the data is discarded from the volatile memory; and
dividing the encoded portion of the data in the second zone across the second plurality of nodes.

16. The computer-readable storage medium of claim 15, wherein the operations further comprise:
executing an erasure encoding task on a portion of data to generate the encoded portion of the data.

17. The computer-readable storage medium of claim 15, wherein the operations further comprise:

storing the encoded portion of the data of the dedicated chunk in the node of the first plurality of nodes.

18. The computer-readable storage medium of claim 15, wherein the operations further comprise:
   detecting the dedicated chunk from chunks in which the encoded portion of the data for a single object is stored.

19. The computer-readable storage medium of claim 18, wherein the detecting the dedicated chunk comprises looking up an identification for the single object.

20. The computer-readable storage medium of claim 15, wherein the operations further comprise:
   determining that the dedicated chunk is sealed, to confirm an immutability property of the dedicated chunk prior to the transferring of the encoded portion of the data of the dedicated chunk from the node of the first plurality of nodes in the first zone to the second zone.

* * * * *